United States Patent [19]

Blossfeld

[11] Patent Number: 5,790,046
[45] Date of Patent: Aug. 4, 1998

[54] SENSOR WITH A PROGRAMMABLE SWITCHING THRESHOLD

[75] Inventor: Lothar Blossfeld, Breitnau, Germany

[73] Assignee: Deutsche ITT Industreis GmbH, Freiburg, Germany

[21] Appl. No.: 496,802

[22] Filed: Jun. 29, 1995

[30] Foreign Application Priority Data

Jun. 30, 1994 [DE] Germany .................. 44 22 867.8

[51] Int. Cl.[6] ............................................... G06F 15/46
[52] U.S. Cl. ........................... 340/825.07; 340/825.06;
340/870.01; 340/870.16; 340/825.62; 340/825.65;
307/116; 307/125; 324/207.2; 324/207.13;
324/207.14
[58] Field of Search .................. 340/825.07, 825.06,
340/825.52, 825.31, 825.34, 825.22, 825.57,
825.62, 825.65, 870.01, 870.16, 0.6; 307/116,
125, 131, 139, 140, 413, 415; 324/207.2,
207.13, 207.14

[56] References Cited

U.S. PATENT DOCUMENTS 4,613,939   9/1986   Paine .......................................... 364/424
4,914,387   4/1990   Santos ......................................... 324/166
5,335,186   8/1994   Tarrant ........................................ 364/550

Primary Examiner—Michael Horabik
Assistant Examiner—Yonel Beaulieu
Attorney, Agent, or Firm—Plevy & Associates

[57] ABSTRACT

A programmable switching threshold sensor including a sensing element having its measurement output terminals connected to a comparator, a current-signal generator, for generating a reference current signal changing in steps. An encoding unit has a code assignable corresponding to the values of the reference current signal. A memory unit is connected to the encoding unit for transferring and storing the code. The reference current signal is coupled to the comparator for comparison with measurement output signals from the sensing element. The output of the comparator is coupled to the memory unit for applying an enable signal permitting the transfer of the code, and a control unit for controlling the signal generator and the encoding unit. The reference signal is a current signal or a voltage signal, depending on the corresponding sensing element and the evaluating circuit used.

22 Claims, 2 Drawing Sheets

SENSOR WITH A PROGRAMMABLE SWITCHING THRESHOLD

FIELD OF THE INVENTION

The present invention relates generally to a sensor, and more particularly to a sensor with a programmable threshold.

BACKGROUND OF THE INVENTION

Sensors with a programmable switching threshold and a method of programming the switching threshold of such a sensor are particularly important in the case of monolithic integrated sensors. Sensors suitable for such programming are all those which sense a change in a physical quantity and deliver an electric signal, particularly Hall effect sensors, pressure sensors, optoelectronic sensors, and corresponding switches, such as Hall effect switches. Particularly if a sensor is used as a switch, a given threshold value must be selected for each application. Since the manufacture of a multitude of different switch types with different preset thresholds is expensive and complicated, such sensors are desirable to be programmed, i.e., their switching thresholds are set.

To this end, it is common practice and well known in the art to deposit on the chip on which the sensor is integrated a resistor network from which the desired resistance value can be obtained by auxiliary pads, by opening the interconnecting lines, or by additional pins provided with the sensor package. This setting of the switching threshold can be performed before the sensor is enclosed in a package. This procedure has the disadvantage that later on, stresses will occur in the sensor which may change the selected switching thresholds. If the thresholds are to be settable after the sensor has been enclosed in a package, the chips must have larger areas because of the necessary additional pads, and the package must be correspondingly large or have additional pins.

It is the object of the invention to provide a sensor having a programmable switching threshold and a method of programming a switching threshold of the sensor which permit simple and reliable programming.

SUMMARY OF THE INVENTION

The present invention is a sensor with a programmable switching threshold. The sensor comprises a sensing element having its measurement output terminals connected to a comparator, a current-signal generator, for generating a reference current signal changing in steps. An encoding unit has a code assignable corresponding to the values of the reference current signal. A memory unit is connected to the encoding unit for transferring the code. The reference current signal is coupled to the comparator for comparison with measurement output signals from the sensing element. The output of the comparator is coupled to the memory unit for applying an enable signal permitting the transfer of the code, and a control unit for controlling the signal generator and the encoding unit. The reference signal is a current signal or a voltage signal, depending on the corresponding sensing element and the evaluating circuit used.

The present invention further provides a method of programming a switching threshold of a sensor. The method comprises the steps of comparing a measurement output signal from a sensing element produced in response to a predetermined measured quantity with a reference signal changing in steps, particularly with a current signal, assigning a code to the respective value of the reference or current signal, and storing that code at which the reference or current signal corresponds to the output signal. The current signal is preferable generated with a D/A converter having a current output. The latter can then provide a step wise changing, i.e., increasing or decreasing, current signal. The code is selected to cause a unique assignment in one direction of change of the current signal. Use is made of a digital code, such as an ascending or descending number sequence. The measurement output signal is produced in response to a predetermined measured quantity. For example, in the case of a Hall effect switch, a fixed magnetic field can be applied which determines a desired switching threshold of the sensor. Thus, the on condition of a Hall effect sensor can be programmed. For example, the code is transferred into the memory unit when the current signal and the measurement output signal are equal, so that the comparator changes state and an enable signal is applied to the memory unit. The memory unit can be an OTP (one-time-programmable) memory.

BRIEF DESCRIPTION OF THE DRAWING

For a full understanding of the present invention, the above objects and further features and advantages of the invention are described in detail in an exemplary embodiment below in conjunction with the drawing, for which.

DETAILED DESCRIPTION OF THE INVENTION

Figure 1:
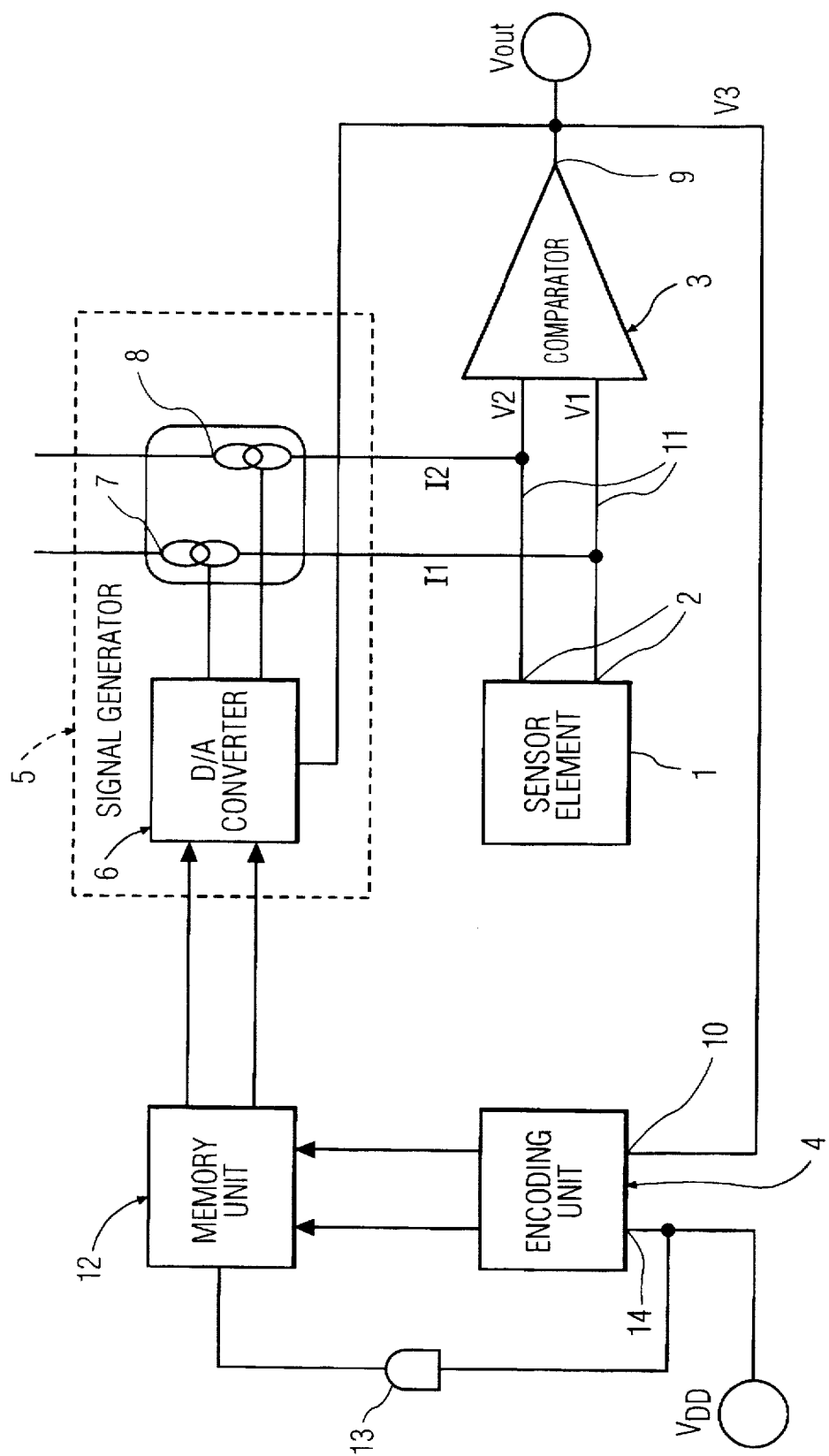
FIG. 1 shows a schematic of the sensor in which two thresholds are programmable.

The present invention is a sensor with a programmable switching threshold. The programmable sensor comprises a sensing element having its measurement output terminals connected to a comparator, a current-signal generator, for generating a reference current signal changing in steps. The reference current signal is coupled to the comparator for comparison with measurement output signals from the sensing element. An encoding unit has a code assignable to the values of the reference or current signal. A memory unit is connected to the encoding unit for transferring the code. The output of the comparator is coupled to the memory unit for applying an enable signal permitting the transfer of the code, and as a control unit for controlling the signal generator and the encoding unit (FIG. 1). The reference signal is a current signal or a voltage signal, depending on the corresponding sensing element and the evaluating circuit used.

The present invention further provides a method of programming a switching threshold of a sensor. This method comprises the steps of comparing a measurement output signal from a sensing element produced in response to a predetermined measured quantity with a reference signal changing in steps, particularly with a current signal, assigning a code to the respective value of the reference or current signal, and storing that code at which the reference or current signal corresponds to the output signal. The current signal is preferably generated with a D/A converter having a current output. The latter can then provide a step wise changing, i.e., increasing or decreasing, current signal. The code is selected to cause a unique assignment in one direction of change of the current signal. Use is made of a digital code, such as an ascending or descending number sequence. The measurement output signal is produced in response to a predetermined measured quantity. For example, in the case of a Hall effect switch, a fixed magnetic field can be applied which determines a desired switching threshold of the sensor. Thus, the on condition of a Hall effect sensor can be programmed. For example, the code is transferred into the memory unit when the current signal and the measurement output signal are equal, so that the comparator changes state and an enable signal is applied to the memory unit. The memory unit can be an OTP (one-time-programmable) memory, such as an EPROM.

With such a sensor and such a method, a switching threshold of the sensor can be programmed in a simple and reliable manner. Programming of the threshold is effected by applying a measured quantity and comparing electric signals produced in response thereto with the generated current signals in the comparator. Programming can thus be carried out on site, after installation of the sensor or chip. In this manner, any change in the threshold due to mechanical stresses is avoided. If desired, the programming of the sensor can be changed. This is possible if the contents of the memory unit are erased. If an OTP memory such as an EPROM is used, this can be done with UV light. Also, no additional external pins are required at the sensor or the sensor package.

In the preferred embodiment of the invention, the output of the comparator is coupled to a stop-signal input of the encoding unit, which is connected to the memory unit for transferring the enable signal. The encoding unit can thus be stopped after the programming of a switching threshold has been completed. Advantageously, a programming code input is connected to a start input of the encoding unit. At the programming code input, the user can then enter a programming code with which the encoding unit, and thus the programming procedure, is started. To program different thresholds, different programming codes may be provided. The respective programming codes are advantageously entered as pulse sequences superimposed on $V_{DD}$.

A memory value freeze logic is provided between the programming-code input and the memory unit. The freeze logic serves to store the current value transferred from the memory unit in a nonvolatile memory. The memory value will then be retained in the memory unit when the supply voltage is turned off. If an OTP memory is used, storage can be effected by applying a high voltage signal to the programming-code input. In that case, the freeze logic can be a switching element which changes to the conducting state when a voltage value is exceeded. This is only appropriate if the sensor is operated at a supply voltage below the voltage required for storage. If the sensor is operated above the voltage required for storage in the memory unit, the freeze logic may respond to, for example, a particular signal applies at the programming code input, particularly a signal in the form of a pulse sequence.

In a further embodiment of the invention, an address code is storable in the memory unit, and a switching element is provided which has three inputs connected to the programming code input, the memory unit, and a power supply, respectively, and which, when the stored address code matches an address code entered by the programming code input, applies the signal from the power supply to the sensing element, the comparator, and the current-signal generator. Thus, the switch is operable by an address code. The address can be called by the $V_{DD}$ voltage line, and activates the sensor. The sensor can then have three states, a standby state, a low-energy state, and a high-energy state. The standby state exists when the sensor is active but its address is not called. Then, the supply voltage is only applied to the parts ahead of the switching element, particularly to the encoding unit and the memory unit. The other parts of the sensor, which follow the switching element, particularly the reference-signal generator, the Hall effect element, and the comparator, are not connected to the supply voltage. The supply voltage is applied to the latter elements only when the sensor is addressed, so that the switching element turns on.

The output of the comparator is coupled to a controlled current source by which the sensing element is controlled. In this manner, a two-wire sensor is obtained.

Storing an address code is appropriate only if the sensor is used in a system of sensors. In that case, the sensors can also be two-wire sensors, which can be addressed by an input transistor. The addressed code can then drive the transistor gate. The address code can be a voltage-pulse sequence positively superimposed on the $V_{DD}$ supply voltage, in which case the sensor remains operational even at a very low battery voltage. In the configuration with an input transistor, the output signal of the respective sensor can be taken from the collector. Thus, the output information of the high-energy or low-energy state or the standby state is obtained. This output information may correspond to three different current values. The two-wire sensors according to the present invention can be used in a bus system, with both the thresholds and the bus addresses of the respective sensors being programmable.

Furthermore, the sensor according to the invention, or its programming, can be used to advantage in a sensor system in which magnetic fields are measured. A magnet whose field is to be measured by the sensor can be replaced, and the sensor can then be adapted to the new magnet reprogramming the switching thresholds without the sensor or the complete system having to be replace.

If silicon Hall effect sensors according to the invention are used in bus systems, the wiring of the system is simplified, which results in increases reliability and a lower price.

Analog sensors, e.g., Hall effect elements, which incorporate a digital system (clock) can also be inserted into such a system. The analog values can then be encoded into and outputted as a digital data stream. This can be advantageous in systems for checking magnetic fields of magnetized metal surfaces, such as weld-checking systems, or in position, velocity, or acceleration sensing systems, or in systems for recognizing magnetic objects in industrial automation. The sensor according to the invention and the method according to the invention can also be used with a differential sensor. For example, the difference between the magnetic fields of two on-chip Hall effect sensing elements can be measured and evaluated. A field difference present in the system the so-called preinduction, which results in an offset, can be eliminated by programming the threshold in a suitable manner.

Furthermore, in carrying out the method according to the invention, it is advantageous if, to program a first switching threshold of the sensor, the change corresponds to an increase of the current signal, and the code to an ascending number sequence. This makes it possible to program the threshold for turning on a sensor used as a switch. To program a second switching threshold, the change may correspond to a decrease of the current signal starting from the current signal corresponding to the first switching threshold, and the code may correspond to a descending number sequence starting from the number assigned to the first switching threshold. This makes it possible to program the threshold for turning off the sensor starting from the first threshold for turning on the sensor. In this case, the turn-on threshold serves as a reference point, so that the current-signal generator changes its signal in the difference. In this manner, greater accuracy is achieved. The current-signal generator can thus be designed to change an absolute value for the first current for the first switching threshold and a difference value for the second current signal for the second switching threshold. A prerequisite is that the difference is always less than the absolute value even if the latter changes its sign, so that oscillation of the comparator is avoided. In the case of all Hall effect sensor used as a switch, the on state and its hysteresis are freely selectable with this method.

Referring to FIG. 1 there is shown a schematic representation in which a Hall effect sensor is used as a switch with two thresholds programmable. The Hall effect sensor has a sensor element 1, whose measurement output terminals 2 are connected to a comparator 3. To program the switching thresholds of the sensor, a magnet (not shown) with a predetermined magnetic field is placed in the region of sensitivity of the sensor element 1, this magnetic field determining the first switching threshold of the sensor. To program this switching threshold, a signal generator 5 is driven by an encoding unit (counting unit) 4. The encoding unit (counting unit) 4 is started by applying a first pulse-sequence signal. The current-signal generator 5 consist of a D/A converter 6 and two current sources 7 and 8 connected to the outputs of the D/A converter. What is important is that two current signals I1, I2 are generable with the signal generator 5. The current signals I1, I2 may also be generated by the D/A converter itself. With the signal generator 5, the output current I1 can be increased in steps, the individual steps being counted by the encoding unit (counting unit) 4. The current I1 from the signal generator 5 is superimposed on the output signal from the sensor element 1. The output signal V1, V2 of the Hall effect element 1 is determined by an externally applied magnetic field. The output 9 of the comparator 3 is coupled to the stop input 10 of the encoding unit (counting unit) 4. When the current I1 from the signal generator 5 becomes so large as to compensate for the output signal V1 from the sensor element 1, the output of the comparator 3 changes state. This change of state causes the encoding unit (counting unit) 4 to be stopped and the current number in the encoding unit (counting unit) 4 to be transferred to and stored in a memory unit 12. To store this numerical value in a nonvolatile state, a freeze logic 13 is provided between the start input 14 of the encoding unit (counting unit) 4 and the memory unit 12. If a given voltage signal is applied to the supply-voltage input $V_{DD}$, the signal will pass through the freeze logic 13 to the memory unit 12, and the numerical values stored there will be stored for the first threshold.

The second current source 8 of the signal generator 5 generates a current signal I2, which is superimposed on the voltage signal V2 from the sensor element 1. With the current source 8, the current can be decreased in steps under control of the encoding unit (counting unit) 4 and the D/A converter 6, starting from the first threshold value stored in the memory unit 12. In the encoding unit (counting unit) 4, a descending number sequence is assigned to the individual steps of the decrease of the current signal I2. The encoding unit (counting unit) 4 is started by applying a second pulse-sequence signal which is different from the first pulse-sequence signal. The second current signal I2 is superimposed on the output signal V2 from the sensor element 1, which is developed in the presence of a magnetic field produced by a second external magnet. When the current signal I2 compensates the output voltage V1, V2 of the sensor element 1, the output of the comparator 3 will change state and will be applied to the stop input 10 of the encoding unit (counting unit) 4 to stop the latter. A control signal which controls either the current source 7 or the current source 8 is transferred over a connecting line between the output of the comparator 3 and the D/A converter 6.

The current numerical value of the encoding unit (counting unit) 4 is transferred into the memory unit 12, where it is stored in a second memory. The change to the nonvolatile state of the memory value is again effected by applying a predetermined voltage signal to the voltage input $V_{DD}$ by the freeze logic 13. The signal generator 5, the encoding unit (counting unit) 4, and the freeze logic 13 are controlled by a control unit (not shown).

Figure 2:
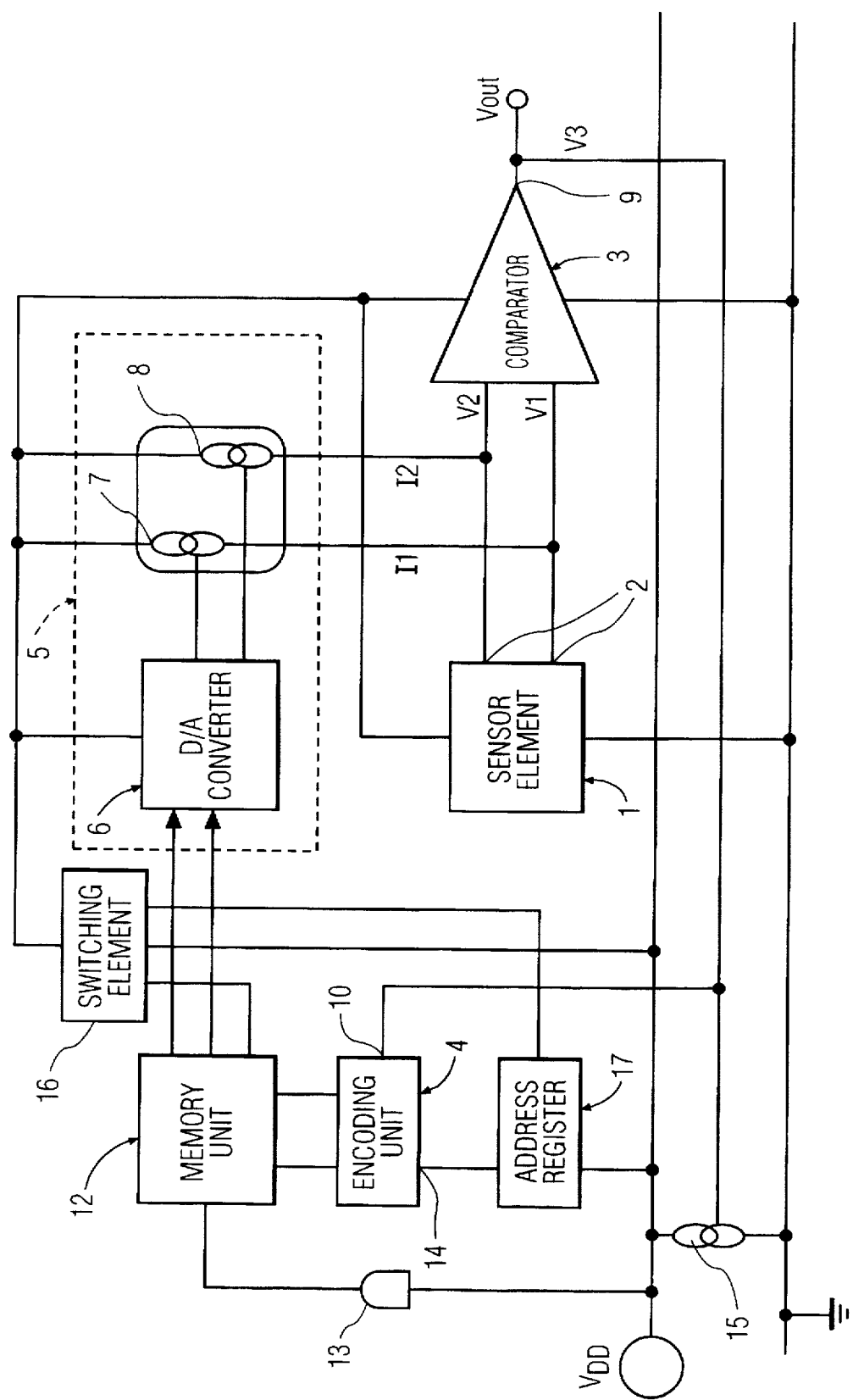
FIG. 2 shows a schematic of a two-wire sensor, in which two thresholds and one address code are programmable.

FIG. 2 shows a second embodiment of the sensor according to the invention. Elements corresponding to those of FIG. 1 are designated by like reference characters. Since the like elements have the same functions as in FIG. 1, only the differences and the additional elements will be described in the following.

The sensor shown is a two-wire sensor. The output 9 of the comparator 3 is connected to a controlled current source 15. The output signal V3 from the comparator 3 controls the current source 15 so that the current value of the latter indicates the state of the comparator 3. Two thresholds of the sensor element 1 at which the latter is to turn on and off, respectively, are programmed as described with reference to FIG. 1. For each threshold, a predetermined magnetic field is placed in the region of sensitivity of the sensor element 1. Then, the current I1 or I2 is varied with the current-signal generator 5 until the output signal V1 or V2 applied to the comparator 3 is compensated. The output signal Vout of the comparator 3 then changes, and as a result, the encoding unit (counting unit) 4 is stopped, and the current number or code contained therein is transferred to and stored in the memory unit 12. In the case of a Hall effect switch, the memory unit 12 contains two values corresponding to the on state and off state of the Hall effect sensor. In the embodiment shown, an address code, by which an identification of the sensor is possible, can be stored in addition to the switching thresholds. The address code is stored in a third area of the memory unit 12. It can be entered by applying a signal at the supply-voltage input $V_{DD}$, e.g., a pulse sequence superimposed on the positive supply voltage. Storage in a nonvoltage state in the memory unit 12 is then effected as described in connection with FIG. 1 with reference to the switching thresholds, namely by means of the freeze logic 13.

A switching element 16 is connected between the memory unit 12 and the signal generator 5. Furthermore, an address register 17 is provided between the input for the positive supply voltage $V_{DD}$ and the switching element 16. A code for the address of the sensor, which code is contained in the supply voltage, is entered into the address register 17. One output of the address register 17 is connected by the encoding unit (counting unit) 4 to the memory unit 12, so that the above-described address storage can be effected by the address register 17. A further output of the address register 17 is coupled to one input of the switching element 16. A further input of the switching element 16 is connected directly to the positive supply voltage $V_{DD}$. The switching element 16 is designed to transfer the signal coming from the supply-voltage input $V_{DD}$ to its output, and thus to the current-signal generator and the subsequent switching elements, i.e., the sensor element 1 and the comparator 3, when the signal applied to it from the memory unit 12 matches the signal applied from the address register 17. Thus, if an address signal is entered with the positive supply voltage $V_{DD}$, it will be applied through the address register 17 to the switching element 16, where it will be compared with the address code stored in the memory unit 12. If the entered address code agrees with the stored value, the supply voltage $V_{DD}$ will be applied through the switching element 16 to the signal generator 5, the sensor element 1, and the comparator 3. In this case, in which the sensor is addressed from outside, all elements of the sensor are activated. Thus, the sensor is active, and will respond at the programmed switching thresholds when a magnetic field is applied. When the sensor is not addressed by an external signal, the switching element 16 cuts off the supply voltage coming from the $V_{DD}$ input. Thus, the supply voltage $V_{DD}$ is not applied to the current-signal generator 5, the Hall effect element 1, and the comparator 3, and the sensor is in a standby state. Such a sensor is preferably used in a system of sensors, e.g., in bus systems. In such a system, all sensors which are not addressed are set to the standby state. Such a sensor has three output states, which are measurable by the value of the current from the current source 15: a high and a low current state according to the threshold values, and the standby state, whose current value is below the two other values. The state of the sensor can be sensed by evaluating circuitry, which can also determine when an active sensor is turned off by an interference pulse.

It will be understood that the embodiment described herein is merely exemplary and that a person skilled in the art may make many variations and modifications without departing from the spirit and scope of the present invention. All such modifications are intended to be included within the scope of the present invention as defined in the appended claims.

What is claimed is:

1. A settable switching threshold sensor comprising:
    sensing means for sensing stimuli and producing first and second output signals;
    encoding means for assigning a code;
    memory means for transferring and storing said code, said memory means coupled to said encoding means;
    signal generator means for generating a reference signal changing in steps, said signal generator means responsive to said code;
    comparator means for producing a switched signal in response to said first and second output signals and said reference signal, wherein said switched signal is operable to control said encoding means.

2. The sensor as recited in claim 1 wherein said encoding means has a stop-signal input adapted to receive said switched signal.

3. The sensor as recited in claim 1 wherein said encoding means has a start input adapted to receive a programming code input.

4. The sensor as recited in claim 3 further comprising freeze logic means for freezing said memory means said freeze logic means responsive to said control means, said freeze logic means coupled between said programming code input and said memory means.

5. The sensor as recited in claim 3 further comprising a switching element and a stored address code, wherein said switching element is responsive to a selection address on said programming code input which corresponds to said stored address code.

6. The sensor as recited in claim 1 further comprising a current source coupled to said switched signal wherein said sensing means is controllable.

7. The sensor as recited in claim 1 wherein said signal generating means is a current signal generator for generating said reference signal changing in steps.

8. The sensor as recited in claim 1 wherein said sensing means is a Hall effect sensor.

9. A sensor with a programmable switching threshold, comprising:
    a sensing element having first and second measurement output terminals connected to a comparator;
    a signal generator for generating a reference signal changing in steps, which is fed to the comparator for comparison with measurement output signals from said first and second output terminals of the sensing element;
    an encoding unit with which a code is assignable to the values of the reference signal;
    a memory unit connected to the encoding unit for transferring the code, with the output of the comparator coupled to the encoding unit, said encoding unit responsive to said comparator output for applying an enable signal to said memory unit for permitting the transfer of the code.

10. The sensor as claimed in claim 9, wherein the output of the comparator is coupled to a stop-signal input of the encoding unit, which is connected to the memory unit for transferring the enable signal.

11. The sensor as claimed in claim 9, wherein a programming code input is connected to a start input of the encoding unit.

12. The sensor as claimed in claim 11, wherein a memory value freeze logic controlled by the control unit is provided between the programming code input and the memory unit.

13. The sensor as claimed in claim 9, wherein an address code is storable in the memory unit, and that a switching element is provided which has three inputs connected to the programming code input, the memory unit, and a power supply, respectively, and which, when said stored address code matches an address code entered by the programming code input, applies the signal from the power supply to the sensing element, the comparator, and the current-signal generator.

14. The sensor as claimed in claim 9, wherein the output of the comparator is coupled to a controlled current source by which the sensing element is controllable.

15. A method of programming a switching threshold of a sensor, comprising the steps of:
    generating first and second output signals from a sensing element responsive to a predetermined measured quantity;
    generating a reference or current signal changing in steps from a signal generating means;
    applying said reference or current signal to one of said first and second output signals;
    comparing said applied reference or current signal with said first and second output signals to produce an output having a first state and a second state;
    assigning a code to the respective value of the reference or current signal; and storing that code at which the output of said comparison transitions from said first state to said second state.

16. The method as claimed in claim 15, wherein programming a first switching threshold, the change corresponds to an increase of the current signal, and the code to an ascending number sequence.

17. The method as claimed in claim 15, wherein programming a second switching threshold, the change corresponds to a decrease of the current signal starting from the current signal corresponding to the first switching threshold, and the code corresponds to a descending number sequence starting from the number assigned to the first switching threshold.

18. The method as claimed in claim 15, wherein the measured quantity is a current signal.

19. The method as claimed in claim 15, wherein an address code assigned to the sensor is stored and then compared with a selected address code which is entered, wherein the sensor is set to a standby state when the stored address code and the selected address code are in disagreement.

20. The method as claimed in claim 18, wherein the code assigned to the respective switching threshold, or the selected address code, is entered as a pulse sequence superimposed on a positive supply voltage.

21. A method of programming a switching threshold of a sensor comprising the steps of:

comparing a first output signal from a sensing element with a second output signal from said sensing element combined with a reference signal changing in steps, said first and second output signals produced in response to a predetermined measured quantity;

assigning a code to the respective value of the reference or current signal;

storing that code at which the reference or current signal in combination with said second output signal corresponds to the first output signal; and wherein the programming of the switching threshold is started by entering a programming code assigned to the respective threshold.

22. The method of claim 21, wherein the programming code is a pulse sequence.

* * * * *